United States Patent [19]
Gilton et al.

[11] Patent Number: 6,063,712
[45] Date of Patent: May 16, 2000

[54] OXIDE ETCH AND METHOD OF ETCHING

[75] Inventors: Terry L. Gilton; David A. Korn, both of Boise, Id.

[73] Assignee: Micron Technology, Inc., Boise, Id.

[21] Appl. No.: 08/977,783

[22] Filed: Nov. 25, 1997

[51] Int. Cl.$^7$ .................................................... H01L 21/00

[52] U.S. Cl. ......................... 438/756; 216/101; 216/109; 252/79.3; 438/748

[58] Field of Search ................................. 252/79.3, 79.2; 216/92, 99, 101, 109; 438/756, 748, 745

[56] References Cited

U.S. PATENT DOCUMENTS

| | | | |
|---|---|---|---|
| 3,107,188 | 10/1963 | Hancock | 438/756 X |
| 3,497,407 | 2/1970 | Esch et al. | 438/756 |
| 3,859,222 | 1/1975 | Squillace et al. | 252/79.3 |
| 4,171,242 | 10/1979 | Liu | 252/79.3 X |
| 5,593,538 | 1/1997 | Davison et al. | 156/637.1 |

OTHER PUBLICATIONS

R, Merrill, "Ion Chromatograhic Determination of Boron and Phosphorus in Chemically Vapor–Deposited Borophosphosilicate Glass (BPSG) Films", *LC GC*, 6, 374, 416–419 (1988).

R. E. Mesmer et al., "Fluoroborate Equilibria in Aqueous Solutions", *Inorganic Chemistry*, 12, 89–95 (1973).

J. Tong et al., "Process and Film Characterization of PECVD Borophosphosilicate Films for VLSI Applications", *Solid State Technology*, 161–170 (1984).

C. Wamser, "Hydrolysis of Fluoboric Acid in Aqueous Solution", *J. Amer. Chem. Soc. 70*, 1209–1215 (1948).

Material Safety Data, "Super Q Etch", *Olin MSDS Control Group*, 11 pgs., (Sep. 1998).

Material Safety Data, "Q Etch II", *Olin MSDS Control Group*, 11 pgs., (Sep. 1998).

*Primary Examiner*—William Powell
*Attorney, Agent, or Firm*—Mueting, Raasch & Gebhardt, P.A.

[57] ABSTRACT

An oxide etchant and method of etching are provided. The etchant includes at least one fluorine-containing compound and at least one auxiliary component selected from the group of a boron-containing compound and a phosphorus-containing compound.

40 Claims, 1 Drawing Sheet

OXIDE ETCH AND METHOD OF ETCHING

FIELD OF THE INVENTION

The present invention relates to etchants and methods for their use in semiconductor device fabrication. In particular, the present invention relates to oxide etchants and methods for etching oxide in semiconductor device fabrication.

BACKGROUND

In semiconductor device fabrication, material is deposited and, oftentimes, patterned to form the many integral layers in a semiconductor device and integrated circuit (IC). Patterning involves masking certain material that is not to be removed and removing unmasked portions of certain material. Oftentimes, photoresist or silicon nitride are used for the masking material. It is important to be able to selectively control the material that is etched in order to not remove the masking material while removing unmasked portions of the material underlying the mask.

Furthermore, oftentimes it is desirable to selectively remove unmasked portions of various materials at different rates. For example, it is often desirable to etch silicon dioxide ($SiO_2$) in the presence of borophosphosilicate glass (BPSG), without simultaneously removing unmasked BPSG. It is also desirable to etch $SiO_2$ without simultaneously etching silicon (Si).

For example, BPSG is used as a dielectric layer because it is easily deposited, provides some margin against mobile ion contamination, and is easily planarized with CMP. However, in this application, one needs to clean or etch $SiO_2$ layers in the presence of BPSG. It is, therefore, necessary to have a method of etching $SiO_2$ at a rate equal to or faster than the etch rate of BPSG.

Hydrofluoric acid (HF) is a conventional component of oxide etchants. Certain HF solutions etch thermally grown $SiO_2$ at a rate of about 1,200 Å/minute. Deposited $SiO_2$, in general, tends to etch at a faster rate than thermally grown $SiO_2$. HF solutions provide selective etch rates of about 100:1 or better for $SiO_2$:Si. HF, however, etches BPSG at a rate of about ten times the rate it etches $SiO_2$, whether it is thermally grown or deposited. This is typically due to the dopants (e.g., phosphorus and boron) in BPSG. This makes it extremely difficult to selectively etch $SiO_2$, particularly thermally grown $SiO_2$, in the presence of BPSG.

Dilute HF and buffered oxide etch (BOE), which is a dilute mixture of HF and ammonium fluoride ($NH_4F$), usually in a ratio of about 1 part HF to 6 parts $NH_4F$ (by volume), are the most prevalent conventional $SiO_2$ etchants. Both dilute HF and BOE are typically diluted in water in a ratio of about 10:1, 20:1, and 100:1 (i.e., 10, 20, or 100 parts (by volume) of water to one part reactive etchant components). Another conventional etchant, sold by Olin Hunt in Chandler, Ariz. that has been used to etch oxide is referred to as "SUPER Q," which is a mixture of $NH_4F$ and phosphoric acid ($H_3PO_4$).

Using such conventional etchants, the highest ratio of reported selectivity for etching $SiO_2$ in the presence of BPSG is 1:2, corresponding to their respective etching rates. Thus, it is desirable to provide an improved $SiO_2$ etchant with enhanced selectivity for etching $SiO_2$ in the presence of BPSG.

SUMMARY OF THE INVENTION

The present invention provides an oxide etchant and method of etching. The oxide etchant includes at least one fluorine-containing compound, in combination with at least one auxiliary component selected from the group of a boron-containing compound and a phosphorus-containing compound. The compositions of the present invention can include mixtures of fluorine-containing compounds, boron-containing compounds, and phosphorus-containing compounds. The etchant can further include a buffering agent, a solvent (e.g., water), a basic component, or combinations of such components. Significantly, the oxide etchant has an etch rate selectivity ratio for silicon dioxide relative to borophosphosilicate glass of at least about 1:1.

The fluorine-containing compound is preferably selected from the group of hydrofluoric acid and ammonium fluoride. The boron-containing compound is preferably selected from the group of ammonium tetraborate, ammonium tetrafluoroborate, potassium borate, sodium borate, boric acid, and fluoroboric acid. The phosphorus-containing compound is preferably selected from the group of ammonium phosphate, potassium phosphate, sodium phosphate, and phosphoric acid.

One embodiment of the oxide etchant includes: at least one fluorine-containing compound; and at least one auxiliary component selected from the group of a borate, a phosphate, phosphoric acid, fluoroboric acid, and boric acid. Another embodiment of the oxide etchant includes: hydrofluoric acid; water; and at least one auxiliary component selected from the group of a boron-containing compound and a phosphorus-containing compound; wherein the oxide etchant has an etch rate selectivity ratio for silicon dioxide relative to borophosphosilicate glass of at least about 1:1. Yet another embodiment of the oxide etchant includes ammonium fluoride, phosphoric acid, ammonium tetraborate tetrahydrate, and water. Still another embodiment includes phosphoric acid, ammonium fluoride, ammonium tetrafluoroborate, acetic acid, and water.

The present invention also provides a method for etching a wafer. One embodiment of the method includes: providing an oxide etchant, wherein the oxide etchant comprises: at least one fluorine-containing compound; and at least one auxiliary component selected from the group of a boron-containing compound and a phosphorus-containing compound; providing a wafer having unmasked silicon dioxide on at least one surface; and contacting the surface of the wafer having unmasked silicon dioxide thereon with the oxide etchant under conditions effective to remove at least a portion of the unmasked silicon dioxide.

Another embodiment of the method includes: providing an oxide etchant, wherein the oxide etchant comprises: at least one fluorine-containing compound; and at least one auxiliary component selected from the group of a borate, a phosphate, phosphoric acid, fluoroboric acid and boric acid; providing a wafer having unmasked silicon dioxide on at least one surface; and contacting the surface of the wafer having unmasked silicon dioxide thereon with the oxide etchant under conditions effective to remove at least a portion of the unmasked silicon dioxide.

Yet another embodiment of the method includes: providing an oxide etchant, wherein the oxide etchant comprises: ammonium fluoride; phosphoric acid; ammonium tetraborate tetrahydrate; and water; providing a wafer having unmasked silicon dioxide on at least one surface and unmasked borophosphosilicate glass on at least one surface; and contacting both the unmasked silicon dioxide and the unmasked borophosphosilicate glass with the oxide etchant under conditions effective to remove the silicon dioxide relative to the borophosphosilicate glass at a selectivity ratio of at least about 1:1.

Yet another embodiment of the method includes: providing an oxide etchant, wherein the oxide etchant comprises: ammonium fluoride; phosphoric acid; ammonium tetrafluoroborate; water; and acetic acid; providing a wafer having unmasked silicon dioxide on at least one surface and unmasked borophosphosilicate glass on at least one surface; and contacting both the unmasked silicon dioxide and unmasked borophosphosilicate glass on at least one surface; and contacting the unmasked silicon dioxide thereon and the unmasked borophosphosilicate glass with the oxide etchant under conditions effective to remove the silicon dioxide relative to the borophosphosilicate glass at a selectivity ratio of at least about 1:1.

Still another embodiment of the method of the present invention includes: providing an oxide etchant having an etch rate selectivity ratio of thermally grown silicon dioxide relative to borophosphosilicate glass of at least about 1: 1; providing a wafer having unmasked silicon dioxide on at least one surface and unmasked borophosphosilicate glass on at least one surface; and contacting both the unmasked silicon dioxide and the unmasked borophosphosilicate glass with the oxide etchant under conditions effective to remove the silicon dioxide relative to the borophosphosilicate glass at a selectivity ratio of at least about 1:1.

BRIEF DESCRIPTION OF THE PREFERRED EMBODIMENTS

FIG. 1 is a cross-section of a wafer having a surface with regions of unmasked silicon dioxide and regions of unmasked borophosphosilicate thereon.

DETAILED DESCRIPTION OF THE PREFERRED EMBODIMENTS

Figure 1:
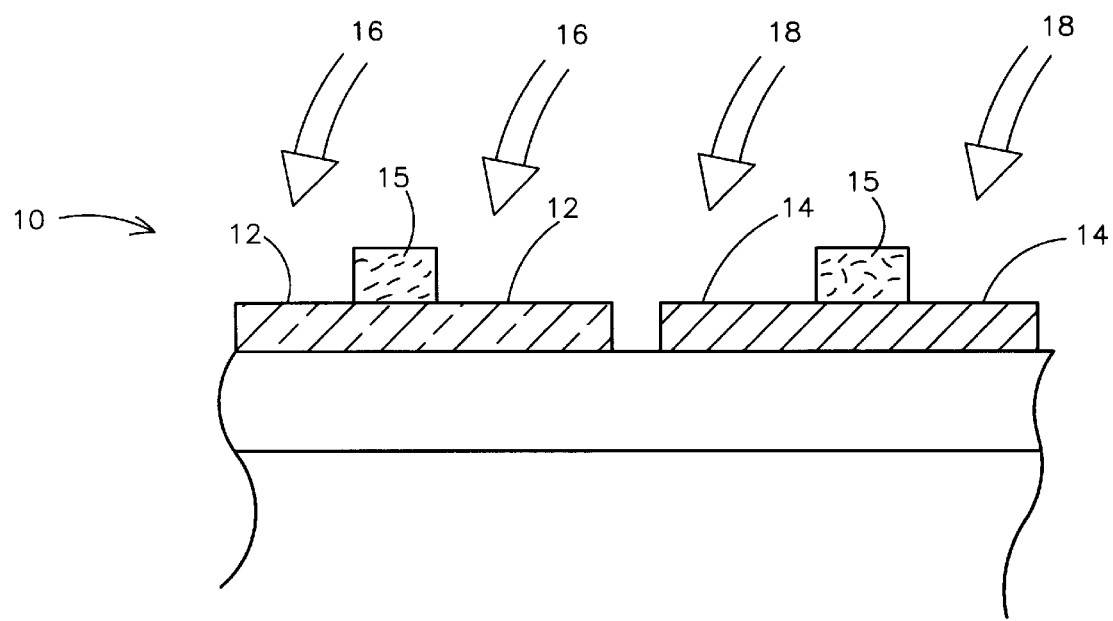

An improved silicon dioxide ($SiO_2$) etchant according to the present invention has an enhanced (i.e., greater than 1:2) etching selectivity for $SiO_2$, whether it be deposited $SiO_2$ or thermally grown $SiO_2$, in the presence of borophosphosilicate glass (BPSG). Oxide etchants according to the present invention are preferably capable of selectively etching $SiO_2$, particularly thermally grown $SiO_2$, in the presence of BPSG at a selectivity ratio of at least about 1:1, and more preferably, at a selectivity ratio of greater than 1:1.

By adding a phosphorus-containing compound, a boron-containing compound, or combinations thereof, to an oxide etchant containing a fluorine species such as hydrofluoric acid, etching of BPSG is retarded due to equilibrium principles. Phosphorus- and boron-containing compounds are products produced when etching BPSG using oxide etchants containing hydrofluoric acid. Thus, by forming an etchant having at least one of these auxiliary components, etching of BPSG is retarded.

The phosphorus-containing compounds are preferably selected from the group of phosphates and phosphoric acid. The boron-containing compounds are preferably selected from the group of borates, boric acid, and fluoroboric acid. The compositions of the present invention can include various combinations of such phosphorus- and boron-containing compounds.

Phosphates according to the present invention are preferably selected from the group of ammonium phosphate, potassium phosphate, and sodium phosphate. More preferably, phosphates according to the present invention are selected from the group of ammonium phosphate and potassium phosphate due to sodium phosphate's ability to contaminate electrical circuits.

Borates according to the present invention are preferably selected from the group of ammonium tetraborate, ammonium tetrafluoroborate, potassium tetraborate, and sodium tetraborate. More preferably, borates according to the present invention are selected from the group of ammonium tetraborate, ammonium tetrafluoroborate, and potassium tetraborate due to sodium tetraborate's ability to contaminate electrical circuits.

Phosphorus- and boron-containing compounds according to the present invention are added to an oxide etchant containing a fluorine species, i.e., fluorine-containing compound, in an amount sufficient to provide the desired enhanced etch rate. This can be determined readily by one of skill in the art. Combinations of various phosphorus- and boron-containing compounds can be used for the desired results.

Preferably, etchant compositions of the present invention include both a boron-containing compound and a phosphorus-containing compound. The boron-containing compound is preferably present in an amount of up to about 10% by weight, and more preferably, in an amount of about 0.1% to about 10% by weight, based on the total weight of the etchant composition. The phosphorus-containing compound is preferably present in an amount of up to about 20% by weight, and more preferably, about 1% to about 20% by weight, based on the total weight of the etchant composition.

In addition to the phosphorus- and boron-containing compounds, the oxide etchant of the present invention includes at least one fluorine-containing compound. Typically, the fluorine-containing compound is hydrofluoric acid (HF) or ammonium fluoride ($NH_4F$). The fluorine-containing compound can be provided in the form of a conventional oxide etchant, such as dilute HF or BOE, which includes a mixture of HF and $NH_4F$, due to their prevalent use in the art of semiconductor fabrication.

The oxide etchant can also include one or more buffering agents, such as is typically used in conventional oxide etchants. The pH of the oxide etchant of the present invention is typically maintained at an appropriate level according to the etch rate desired. Preferably, the pH of the oxide etchant can be from about 1 to about 13. More preferably, the etch rate desired will correspond to a pH of about 4 to about 10, and most preferably, the etch rate desired will correspond to a pH of about 7.

When a basic phosphorous- or boron-containing compound is utilized, a suitable amount of an acidic component can be added to the oxide etchant to neutralize the basic effects of the compound, depending on the desired pH. A wide variety of acidic components can be utilized, such as acetic acid, for example.

When an acidic phosphorus- or boron-containing compound is utilized, a suitable amount of a basic component can be added to the oxide etchant to neutralize the acidic effects of the compound, depending on the desired pH. A wide variety of basic components can be utilized, such as ammonium hydroxide or sodium hydroxide, for example. Preferable, however, sodium hydroxide is not used due to sodium's ability to contaminate electrical circuits.

The oxide etchant of the present invention typically includes a solvent preferably water, for dilution of the reactive species, the extent of which varies according to the etch rate desired. Typically, reactive etchant components according to the present invention (i.e., fluoride-, boron-, phosphorus-containing species and buffering agents) are diluted in water in a ratio of about 6:1 to about 100:1 (about 6 parts to about 100 parts (by volume) of water to one part reactive etchant component).

A preferred oxide etchant of the present invention includes ammonium fluoride, phosphoric acid, ammonium tetraborate tetrahydrate, and water. Preferably, the ammonium fluoride is present in an amount of about 10% to about 40% by weight, the phosphoric acid is present in an amount up to about 20% by weight, and the ammonium tetraborate tetrahydrate is present in an amount of about 1% to about 10% by weight, based on the total weight of the etchant composition.

Another preferred oxide etchant of the present invention includes ammonium fluoride, phosphoric acid, ammonium tetrafluoroborate, acetic acid, and water. Preferably, the ammonium fluoride is present in an amount of about 10% to about 40% by weight, the phosphoric acid is present in an amount up to about 20% by weight, and the ammonium tetrafluoroborate is present in an amount of about 0. 1% to about 10% by weight, and the acetic acid is present in an amount of about 1% to about 10% by weight, based on the total weight of the etchant composition.

Semiconductor wafers having $SiO_2$ to be removed are patterned according to the desired removal of $SiO_2$. Patterning is well known to one skilled in the art and includes applying a resist to a surface of the wafer, exposing the resist (e.g., using photolithography or an e-beam), and developing the exposed resist to produce a patterned resist layer of the wafer. $SiO_2$ to be removed is unmasked by the remaining resist layer. The wafer may also have unmasked BPSG thereon, but it is not necessary to the practice of the present invention. An exemplary wafer is shown in FIG. 1, which is a cross-section of a wafer 10 having regions of unmasked silicon dioxide 12 and regions of unmasked borophosphosilicate glass 14 thereon. The masks are represented by 15.

The patterned wafer is then placed in the oxide etchant of the present invention (represented in FIG. 1 by arrows 16) to remove at least a portion of the unmasked $SiO_2$12. If unmasked BPSG 14 is also present on the wafer 10, at least a portion of it is also removed by the oxide etchant of the present invention (represented in FIG. 1 by arrows 18). The etch rate of BPSG when utilizing an oxide etchant of the present invention, however, is relatively lower than when conventional oxide etchants are utilized. Thus, preferably, a selective etch ratio of at least about 1:1, and more preferably, a selectivity ratio of greater than 1:1, for $SiO_2$, particularly for thermally grown $SiO_2$, relative to BPSG can be achieved. Depending on the composition of the oxide etchant of the present invention, other selective etch ratios are also within the scope of the present invention, some of which may be more or less desirable than a ratio of 1:1.

Many methods and apparatus exist for etching a surface of a wafer using a wet chemical (as represented by arrows 16 and 18 in FIG. 1), such as the oxide etchant of the present invention. For example, one or more wafers can be placed in a boat and then immersed in a bath of the oxide etchant. The oxide etchant can also be sprayed on the surface of the wafer. It is preferable to utilize a method and apparatus where a constant supply of replenished oxide etchant (i.e., a substantially constant amount of the reactive components of the oxide etchant have not reacted) contacts the surface of the wafer. By maintaining a constant supply of replenished oxide etchant at the surface of the wafer, uniform etch rates can desirably be maintained to allow for process uniformity. Furthermore, it is desirable that the etch rate of the oxide etchant not slow to such a degree that throughput is reduced. For example, when the concentration of products in the oxide etchant is greater than the concentration of reactants for the particular material etched, the etch rate of the particular material becomes slower. Therefore, the oxide: etchant can be agitated in a bath, for example, to maintain a desirable and continuous etch rate.

The temperature of the oxide etchant is preferably maintained during the etch at a constant temperature. Preferably, the oxide etchant temperature is within a range of about −10° C. to about 100° C. Typically, the temperature of the oxide etchant is about room temperature (i.e., about 20° C. to about 30° C.), although higher temperatures can be utilized when faster etch rates are desired. Preferably, however, lower temperatures are used to improve the selectivity of $SiO_2$ over BPSG.

The following examples are given to illustrate specific preferred embodiments of the present invention. Numerous other variations, however, are within the scope of the present invention.

EXAMPLES

Example 1

This example provides an etchant that will etch thermally grown silicon dioxide faster than BPSG. A wafer was provided that had unmasked regions of thermally grown $SiO_2$ and unmasked regions of BPSG. The BPSG used contained 7 wt-% phosphorous and 3.8 wt-% boron. It was annealed in a rapid thermal processing (RTP) apparatus for 20 seconds at 1000° C. and reflowed for 10 minutes at 750° C. The etchant composition was as follows:

| Chemical | | Wt. % in etchant |
| --- | --- | --- |
| Phosphoric Acid | $H_3PO_4$ | 14.7 |
| Ammonium Fluoride | $NH_4F$ | 33.0 |
| Ammonium Tetraborate | $(NH_4)_2(B_4O_7).4H_2O$ | 1.0 |
| Water | $H_2O$ | 51.3 |

Test wafers were immersed in a filtered and recirculated bath in a semiautomatic wet process station. The temperature was controlled at 25° C. The exposure time was 2 minutes. The BPSG etch rate was 410 Å/minute, whereas the $SiO_2$ etch rate was 424 Å/minute, for an etch rate selectivity ratio of 1.03:1 ($SiO_2$ to BPSG).

Example 2

This example provides an etchant that will etch thermally grown silicon dioxide faster than BPSG. A wafer was provided that had unmasked regions of thermally grown $SiO_2$ and unmasked regions of BPSG. The BPSG used contained 7 wt-% phosphorous and 3.8 wt-% boron. It was annealed in a rapid thermal processing (RTP) apparatus for 20 seconds at 1000° C. and reflowed for 10 minutes at 750° C. The etchant composition was as follows:

| Chemical | | Wt. % in etchant |
| --- | --- | --- |
| Phosphoric Acid | $H_3PO_4$ | 5.0 |
| Ammonium Fluoride | $NH_4F$ | 35.4 |
| Ammonium Tetrafluoroborate | $NH_4BF_4$ | 0.5 |
| Acetic Acid | $CH_3COOH$ | 2.2 |
| Water | $H_2O$ | 56.9 |

Test wafers were immersed in a filtered and recirculated bath in a semiautomatic wet process station. The temperature was controlled at 25° C. The exposure time was 2 minutes. The etch rate selectivity ratio was 1.18:1 ($SiO_2$ to BPSG).

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

We claim:

1. An oxide etchant comprising:
   at least one fluorine-containing compound; and
   at least one boron-containing compound.

2. The oxide etchant of claim 1, further comprising a buffering agent.

3. The oxide etchant of claim 1, further comprising a basic component.

4. The oxide etchant of claim 1, further comprises a solvent.

5. The oxide etchant of claim 1, wherein the boron-containing compound is selected from the group of ammonium tetraborate, ammonium tetrafluoroborate, potassium borate, sodium borate, boric acid, and fluoroboric acid.

6. The oxide etchant of claim 1, wherein the phosphorus-containing compound is selected from the group of ammonium phosphate, potassium phosphate, sodium phosphate, and phosphoric acid.

7. The oxide etchant of claim 1, wherein the oxide etchant has a pH of about 4 to about 10.

8. The oxide etchant of claim 1, wherein the fluorine-containing compound is selected from the group of hydrofluoric acid and ammonium fluoride.

9. The oxide etchant of claim 1, wherein the oxide etchant has an etch rate selectivity ratio for silicon dioxide relative to borophosphosilicate glass of at least about 1:1.

10. The oxide etchant of claim 9, wherein the oxide etchant has an etch rate selectivity ratio for thermally grown silicon dioxide relative to borophosphosilicate glass of at least about 1:1.

11. An oxide etchant comprising:
    at least one fluorine-containing compound; and
    at least one auxiliary component selected from the group of a borate, fluoroboric acid, and boric acid.

12. The oxide etchant of claim 11, wherein the fluorine-containing compound is selected from the group of hydrofluoric acid and ammonium fluoride.

13. The oxide enchant of claim 12, wherein the oxide etchant has a pH of about 4 to about 10.

14. The oxide etchant of claim 12, wherein the oxide etchant has an etch rate selectivity ratio for silicon dioxide relative to borophosphosilicate glass of at least about 1:1.

15. The oxide etchant of claim 14, wherein the oxide etchant has an etch rate selectivity ratio for thermally grown silicon dioxide relative to borophosphosilicate glass of at least about 1:1.

16. An oxide etchant comprising:
    hydrofluoric acid;
    at least one boron-containing compound; and
    water;
    wherein the oxide etchant has an etch rate selectivity ratio for silicon dioxide relative to borophosphosilicate glass of at least about 1:1.

17. The oxide etchant of claim 16, further comprising a phosphorus-containing compound.

18. The oxide etchant of claim 17, wherein the boron-containing compound is present in an amount of about 1% to about 10% by weight, and the phosphorus-containing compound is present in an amount of about 1% to about 20% by weight, based on the total weight of the etchant composition.

19. An oxide etchant comprising:
    ammonium fluoride;
    phosphoric acid;
    ammonium tetraborate tetrahydrate; and
    water.

20. The oxide etchant of claim 19, wherein the ammonium fluoride is present in an amount of about 10% to about 40% by weight, the phosphoric acid is present in an amount up to about 20% by weight, and the ammonium tetraborate tetrahydrate is present in an amount of about 1% to about 10% by weight, based on the total weight of the etchant composition.

21. The oxide etchant of claim 20, wherein the oxide etchant has an etch rate selectivity ratio of thermally grown silicon dioxide relative to borophosphosilicate glass of at least about 1:1.

22. An oxide etchant comprising:
    ammonium fluoride;
    phosphoric acid;
    ammonium tetrafluoroborate;
    acetic acid; and
    water.

23. A method for etching a wafer, the method comprising:
    providing an oxide etchant, wherein the oxide etchant comprises:
      at least one fluorine-containing compound; and
      at least one boron-containing compound;
    providing a wafer having unmasked silicon dioxide on at least one surface; and
    contacting the surface of the wafer having unmasked silicon dioxide thereon with the oxide etchant under conditions effective to remove at least a portion of the unmasked silicon dioxide.

24. The method of claim 23, wherein the step of contacting the surface of the wafer comprises immersing the wafer in a bath of the oxide etchant, spraying the surface of the wafer with the oxide etchant, or both the immersing and spraying steps.

25. The method of claim 23, wherein the wafer further includes unmasked borophosphosilicate glass on at least one surface, and the contacting step comprises contacting both the unmasked silicon dioxide and the unmasked borophosphosilicate glass under conditions effective to remove the silicon dioxide relative to the borophosphosilicate glass at a selectivity ratio of at least about 1:1.

26. A method of etching a wafer, the method comprising:
    providing an oxide etchant, wherein the oxide etchant comprises:
      at least one fluorine-containing compound; and
      at least one auxiliary component selected from the group of a borate, fluoroboric acid, and boric acid;
    providing a wafer having unmasked silicon dioxide on at least one surface; and
    contacting the surface of the wafer having unmasked silicon dioxide thereon with the oxide etchant under conditions effective to remove at least a portion of the unmasked silicon dioxide.

27. The method of claim 26, wherein the wafer further includes unmasked borophosphosilicate glass on at least one surface, and the contacting step comprises contacting both the unmasked silicon dioxide and the unmasked borophosphosilicate glass under conditions effective to remove the silicon dioxide relative to the borophosphosilicate glass at a selectivity ratio of at least about 1:1.

28. A method of etching a wafer, the method comprising:
providing an oxide etchant, wherein the oxide etchant comprises:
ammonium fluoride;
phosphoric acid;
ammonium tetraborate tetrahydrate; and
water;
providing a wafer having unmasked silicon dioxide on at least one surface and unmasked borophosphosilicate glass on at least one surface; and
contacting both the unmasked silicon dioxide and the unmasked borophosphosilicate glass with the oxide etchant under conditions effective to remove the silicon dioxide relative to the borophosphosilicate glass at a selectivity ratio of at least about 1:1.

29. A method of etching a wafer, the method comprising:
providing an oxide etchant, wherein the oxide etchant comprises:
ammonium fluoride;
phosphoric acid;
ammonium tetrafluoroborate;
acetic acid; and
water;
providing a wafer having unmasked silicon dioxide on at least one surface and unmasked borophosphosilicate glass on at least one surface; and
contacting both the unmasked silicon dioxide and the unmasked borophosphosilicate glass with the oxide etchant under conditions effective to remove the silicon dioxide relative to the borophosphosilicate glass at a selectivity ratio of at least about 1:1.

30. A method of etching a wafer, the method comprising:
providing an oxide etchant having an etch rate selectivity ratio of thermally grown silicon dioxide relative to borophosphosilicate glass of at least about 1:1;
providing a wafer having unmasked thermally grown silicon dioxide on at least one surface and unmasked borophosphosilicate glass on at least one surface; and
contacting both the unmasked thermally grown silicon dioxide and the unmasked borophosphosilicate glass with the oxide etchant under conditions effective to remove the silicon dioxide relative to the borophosphosilicate glass at a selectivity ratio of at least about 1:1.

31. An oxide etchant comprising:
at least one fluorine-containing compound; and
at least one phosphorus-containing compound in an amount up to about 20% by weight based on the total weight of the oxide etchant wherein the oxide etchant has an etch rate selectivity ratio of thermally grown silicon dioxide relative to borophosphosilicate glass of at least about 1:1.

32. An oxide etchant comprising:
at least one fluorine-containing compound; and
at least one phosphorous-containing compound selected from the group of a phosphate and phosphoric acid wherein the phosphorus-containing compound is present in an amount up to about 20% by weight based on the total weight of the oxide etchant wherein the oxide etchant has an etch rate selectivity ratio of thermally grown silicon dioxide relative to borophosphosilicate glass of at least about 1:1.

33. An oxide etchant comprising:
hydrofluoric acid;
at least one phosphorus-containing compound in an amount up to about 20% by weight based on the total weight of the oxide etchant; and
water;
wherein the oxide etchant has an etch rate selectivity ratio for silicon dioxide relative to borophosphosilicate glass of at least about 1:1.

34. A method for etching a wafer, the method comprising:
providing an oxide etchant, wherein the oxide etchant comprises:
at least one fluorine-containing compound; and
at least one phosphorus-containing compound in an amount up to about 20% by weight based on the total weight of the oxide etchant;
providing a wafer having unmasked silicon dioxide on at least one surface; and
contacting the surface of the wafer having unmasked silicon dioxide thereon with the oxide etchant under conditions effective to remove at least a portion of the unmasked silicon dioxide wherein the oxide etchant has an etch rate selectivity ratio of thermally grown silicon dioxide relative to borophosphosilicate glass of at least about 1:1.

35. A method of etching a wafer, the method comprising:
providing an oxide etchant, wherein the oxide etchant comprises:
at least one fluorine-containing compound; and
at least one phosphorous-containing compound selected from the group of a phosphate and phosphoric acid, wherein the phosphorus-containing compound is present in an amount up to about 20% by weight based on the total weight of the etchant composition;
providing a wafer having unmasked silicon dioxide on at least one surface; and
contacting the surface of the wafer having unmasked silicon dioxide thereon with the oxide etchant under conditions under conditions effective to remove at least a portion of the unmasked silicon dioxide wherein the oxide etchant has an etch rate selectivity ratio of thermally grown silicon dioxide relative to borophosphosilicate glass of at least about 1:1.

36. The oxide etchant of claim 1, further comprising at least one phosphorous-containing compound.

37. The oxide etchart of claim 23, further comprising at least one phosphorous-containing compound.

38. The oxide ctchant of claim 31, further comprising at least one boron-containing compound.

39. The oxide etchant of claim 31 having a pH of about 7.

40. The method of claim 34 wherein the oxide etchant has a pH of about 7.

* * * * *

UNITED STATES PATENT AND TRADEMARK OFFICE
CERTIFICATE OF CORRECTION

PATENT NO. : 6,063,712  
DATED : May 16, 2000  
INVENTOR(S) : Gilton et al.

Page 1 of 1

It is certified that error appears in the above-identified patent and that said Letters Patent is hereby corrected as shown below:

Column 7,
Line 21, delete "1" and insert -- 36 --.

Signed and Sealed this

Ninth Day of October, 2001

Attest:

NICHOLAS P. GODICI  
Attesting Officer  
Acting Director of the United States Patent and Trademark Office